United States Patent [19]

Kitatani et al.

[11] Patent Number: 5,747,864
[45] Date of Patent: May 5, 1998

[54] LIGHT RECEIVING ELEMENT AND A METHOD OF FABRICATING THE SAME

[75] Inventors: Takeshi Kitatani, Hitachi; Yoshiaki Yazawa, Hitachioota; Junko Minemura, Kodaira; Akira Sato, Takahagi; Terunori Warabisako, Tokyo, all of Japan

[73] Assignee: Hitachi, Ltd., Tokyo, Japan

[21] Appl. No.: 688,741

[22] Filed: Jul. 31, 1996

Related U.S. Application Data

[63] Continuation of Ser. No. 280,997, Jul. 27, 1994, abandoned.

[30] Foreign Application Priority Data

Aug. 6, 1993 [JP] Japan ............... 5-196058

[51] Int. Cl.$^6$ .................. H01L 29/04; H01L 31/075
[52] U.S. Cl. .................. 257/458; 257/184; 257/53
[58] Field of Search .................. 257/53, 458, 184

[56] References Cited

U.S. PATENT DOCUMENTS

| | | | |
|---|---|---|---|
| 3,324,297 | 6/1967 | Stieltjes | 257/53 |
| 4,962,412 | 10/1990 | Shinohara | 257/53 |
| 5,262,654 | 11/1993 | Yamazaki | 257/53 |

*Primary Examiner*—Jerome Jackson
*Attorney, Agent, or Firm*—Antonelli, Terry, Stout, & Kraus, LLP

[57] ABSTRACT

A light receiving element having excellent characteristics, including high sensitivity and high response speed, can be achieved by a light element comprising unit structures each having two pn junction semiconductor layers, and a lightly doped semiconductor layer having low impurity density, lower than those of the p-type regions and the n-type regions of the two pn junction semiconductor layers, and which is sandwiched between the two pn junction semiconductor layers. The p-type regions of the pn junction semiconductor layers are disposed opposite to each other on opposite sides of the lightly doped semiconductor layer, respectively, and the n-type regions of the pn junction semiconductor layers are disposed opposite to each other on the opposite sides of the lightly doped semiconductor layer, respectively. In a method of fabricating such a light receiving element, using controlled shutters or an ion beam apparatus, the layers are formed of optimum semiconductors, in an optimum thickness and in optimum impurity densities. In this structure, photogenerated carriers move mainly through the lightly doped semiconductor layer. Therefore, the lifetime of the carriers is increased, and the drift mobility of the carriers is enhanced, so that the light receiving element is able to function with a high sensitivity at a high response speed.

11 Claims, 7 Drawing Sheets

LIGHT RECEIVING ELEMENT AND A METHOD OF FABRICATING THE SAME

This is a continuation of application Ser. No. 08/280,997, filed Jul. 27, 1994 abandoned.

BACKGROUND OF THE INVENTION

The present invention relates to a thin-film light receiving element and a method of fabricating the same and, more particularly, to a light receiving element capable of operating in a high sensitivity at a high response speed, and a method of fabricating the same.

A pin junction photodiode structure illustrated by FIG. 31 on p. 297 in S. M. Sze "Semiconductor Device", Sangyo Tosho is one of the most general light receiving element structures. Since this pin junction photodiode structure has a pn junction formed along the buildup direction, carriers generated by the incident light are accelerated by the built-in electric field of the junction and move in the buildup direction to produce a current. In this pin junction photodiode structure, the p-type layer is formed with a small thickness and an i-type layer having a comparatively large thickness and a high resistance is formed in the junction to increase the region applied electric field and to move many carriers quickly to the electrode so that the sensitivity and the response speed of the pin type photodiode are enhanced. In some cases, the reverse bias voltage is applied to the junction to increase the drift electric field.

SUMMARY OF THE INVENTION

In this light receiving element, the photosensitivity and the response speed are important factors affecting the performance of the light receiving element, and it is desirable that the light receiving element has a high sensitivity and a high response speed. The sensitivity and the response speed are dependent on the lifetime of the carriers generated by light and on the traveling time for the carriers to reach the electrode. When the lifetime of the carriers is extended, the gain of the photoelectric current increases and, consequently, the sensitivity is enhanced. The traveling time is dependent on the drift electric field and drift mobility; and so, the shorter the traveling time, the higher is the response speed.

As mentioned above, since an element having the conventional structure has a pn junction formed in the built-up direction, photogenerated carriers move through the p-type region and the n-type region of the element. Therefore, a reduction in the lifetime of the carriers due to recombination, and a reduction in the drift mobility thereof due to the scattering of impurity ions, are unavoidable. A reverse bias voltage is applied to the junction to increase the drift electric field so that the traveling time of the carriers is shortened. However, an increase in the bias voltage causes a reduction in the S/N ratio.

Accordingly, both the drift mobility and the lifetime of the carriers must be improved to realize a light receiving element capable of operating with a high sensitivity at a high response speed and at a low bias voltage.

The present invention has been made to solve the problems in the aforesaid conventional art and it is therefore an object of the present invention to provide a light receiving element capable of operating with a high sensitivity at a high response speed, and a method of fabricating such a light receiving element.

Figure 1:
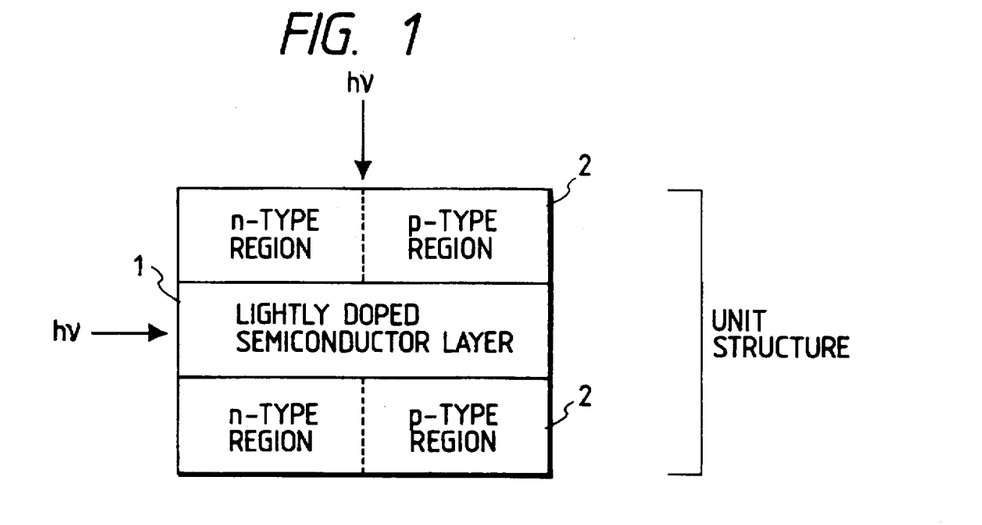
FIG. 1 is a typical sectional view of a light receiving element in accordance with this invention.

With the foregoing object in view, the present invention provides a light receiving element comprising unit structures each comprising two pn junction semiconductor layers, and a lightly doped semiconductor layer having a low impurity density lower than those of the p-type regions and the n-type regions of the two pin junction semiconductor layers, and which is sandwiched between the two pn junction semiconductor layers; characterized in that the p-type regions of the pn junction semiconductor layers are disposed opposite to each other on the opposite sides of the lightly doped semiconductor layer, respectively, and the n-type regions of the pn junction semiconductor layers are disposed opposite to each other on the opposite sides of the lightly doped semiconductor layer, respectively. As shown in FIG. 1, the unit structure of the light receiving element comprises two pn junction semiconductor layers, and a lightly doped semiconductor layer having a low impurity density, lower than those of the pn junction semiconductor layers, and which is sandwiched between the pn junction semiconductor layers.

Figure 2:
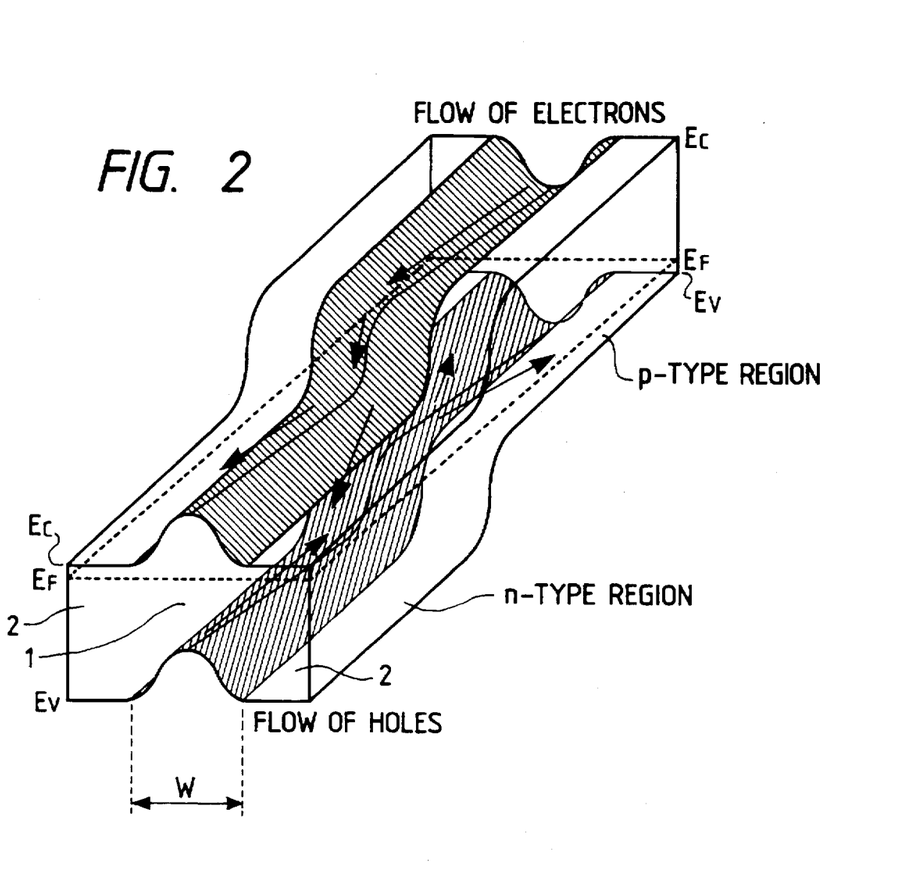
FIG. 2 is a diagrammatic view of the energy band structure of a light receiving element in accordance with this invention.

The band structure is dependent on the semiconductors, and the thickness and the impurity densities of the layers. In a structure formed of a single semiconductor, when the thickness W of the lightly doped semiconductor layer is smaller than a thickness necessary for forming a depletion region of the pn junction, which is dependent on the impurity densities of the regions, a band structure in which the energy of the lightly doped semiconductor layer is low in the vicinity of the p-type region and the energy of the lightly doped semiconductor layer is high in the vicinity of the n-type region, as shown in FIG. 2, is formed. In FIG. 2, indicated at $E_c$ is the bottom energy of a conduction band, at $E_v$ is the summit energy of a valence band and at $E_f$ is Fermi energy. A potential slope in the horizontal direction along the surface of the substrate is formed in the lightly doped semiconductor layer due to the difference between the work function of the p-type region and that of the n-type region. Electrons, i. e., the minority carriers generated in the p-type region, flow through the lightly doped semiconductor layer according to the potential slope, reach the n-type region and are collected as an output at the electrode. The holes generated in the n-type region flow in the reverse direction.

Figure 3:
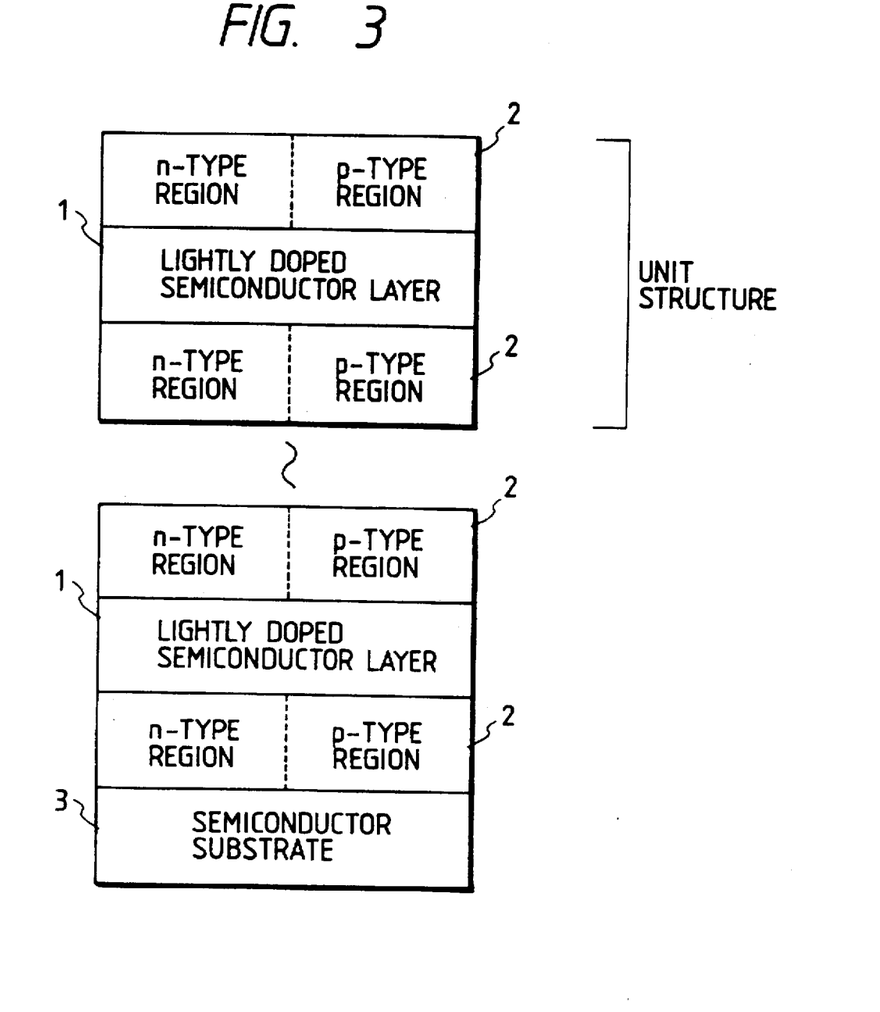
FIG. 3 is a typical sectional view of a light receiving element comprising thin semiconductor layers in accordance with this invention.
Figure 4:
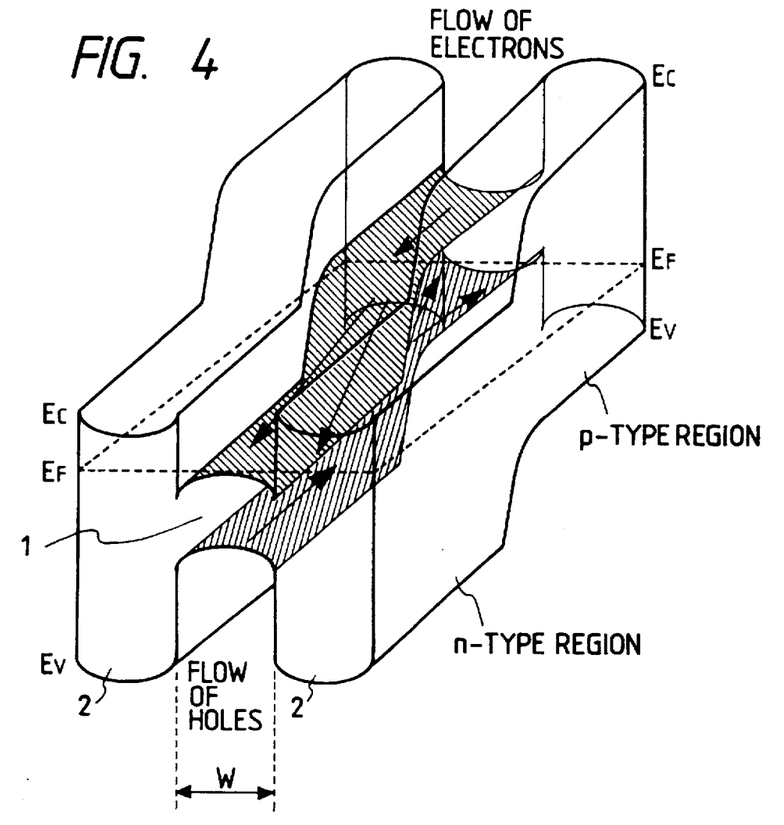
FIG. 4 is a diagrammatic view of the energy band structure of a light receiving element in accordance with this invention.

In another structure formed by stacking the unit structures on a semiconductor substrate, as shown in FIG. 3, a semiconductor having a large band gap can be used for forming the p-type and n-type doped layers, and an intrinsic semiconductor having a band gap smaller than that of the semiconductor forming the p-type and n-type doped layers can be used for forming the lightly doped semiconductor layer, i.e., an i-type layer. When these layers are joined together, majority carriers move from the impurity-doped semiconductor layer into the intrinsic semiconductor layer, and the band is distorted by the charge distribution of the remaining impurity ions. Consequently, a two-dimensional carrier layer where carriers can not move freely in a direction perpendicular to the layer is formed within the i-type layer at the interface between the i-type layer and the impurity-doped layer, which is known as a modulated doped structure. Carriers move through the modulated doped structure with a high drift mobility. In this modulated doped structure, similarly to the foregoing example, a potential slope is formed in a horizontal direction along the major surface of the substrate within the i-type layer due to the work function difference between the p-type and n-type impurity-doped layers, and hence the element has a band structure as shown in FIG. 4. In this band structure, it is considered that electrons and holes move the two-dimensional carrier layer formed on the opposite sides of the i-layer where impurity scattering does not occur. When a superlattice structure is formed by stacking a plurality of unit structures, a plurality of band structures similar to that shown in FIG. 2 or 4 are formed in the built-up direction and then a characteristic subband is formed in each quantum well.

Figure 5:
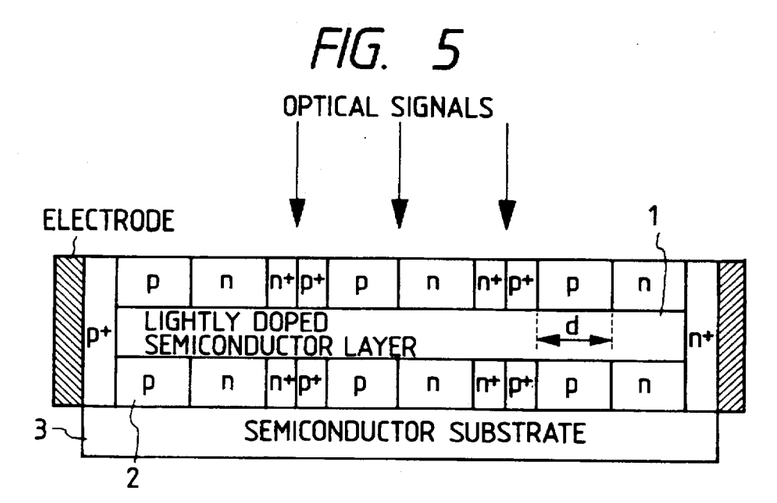
FIG. 5 is a typical view of a light receiving element having a structure in accordance with this invention formed on a semiconductor substrate having a large area.

When a structure in accordance with the present invention is formed on a substrate having a large area, such as an area 10 cm square, the width d of a p-type or n-type region in contact with a lightly doped semiconductor layer will be much greater than the carrier diffusion length, and so the ratio of carriers that are annihilated by recombination before reaching the electrode to all the carriers increases. A structure as shown in FIG. 5 may be effective to realize the effect of the present invention in a element used for a substrate having a large area The structure shown in FIG. 5 is formed by arranging the unit structures of the present invention along a horizontal direction on a semiconductor substrate with a heavily doped p$^+$-type region and a heavily doped n$^+$-type region sandwiched for tunnel junction between the adjacent unit structures. Highly doped layers for collecting carriers are formed at the opposite ends of the arrangement of the unit structures, and electrodes are connected to the highly doped layers, respectively. The width d of the p-type region (or the n-type region) is determined, taking into consideration the carrier diffusion length, and is a value in the range of several micrometers to tens of micrometers.

The present invention proposes a light receiving element having a new structure that extends the lifetime of carriers and enhances the drift mobility of carriers, which have been important problems in conventional light receiving elements. Band structures as shown in FIGS. 2 and 4 are formed in the light receiving elements having a structure in accordance with the present invention.

The band structure shown in FIG. 2 is formed in a light receiving element of a single semiconductor, in which electrons generated in the vicinity of a p-type region move through the central part of a lightly doped semiconductor layer, flow toward the opposite ends of the layer after reaching an n-type region and reach an electrode. Holes generated in the n-type region move in the reverse direction. Since minority carriers flow mainly through the lightly doped semiconductor layer, impurity scattering is reduced and drift mobility is enhanced. The electrons generated in the vicinity of the p-type region are transmitted through the central part of the lightly doped semiconductor layer and the holes are transmitted through the opposite side parts of the lightly doped semiconductor layer. The reverse condition is created in the vicinity of the n-type region. Since the electrons are transmitted through the central part of the lightly doped semiconductor layer while the holes are transmitted through the opposite side parts of the lightly doped semiconductor layer, the recombination of the electrons and the holes can be reduced by the spatial separation of electrons and holes. Furthermore, since the electrons and the holes are transmitted through the lightly doped semiconductor layer, the influence of Auger recombination, i. e., a process of recombination greatly dependent on impurity density, can be reduced. Consequently, recombination loss is reduced greatly and the lifetime of the carriers can increase. The enhancement of drift mobility and the lifetime of the carriers provide a light receiving element which has a considerably high sensitivity and a high response speed. As regards the transmission of electrons in the vicinity of the n-type region within the lightly doped semiconductor layer, or the transmission of holes in the vicinity of the p-type region within the lightly doped semiconductor layer in the structure shown in FIG. 2, it is highly probable that the carriers will diffuse into the highly doped p-type regions and the highly doped n-type regions and reach the electrode.

In a modulation doped structure, as shown in FIG. 4, employing two kinds of semiconductors respectively having different band gaps, the generated carriers are caused to be transmitted mainly through a two-dimensional carrier layer formed at the opposite ends of an intrinsic semiconductor layer by potential barriers on the opposite sides and, consequently, the carriers are able to travel with a high drift mobility to the electrode. Furthermore, the structure has an advantage that the distortion of the band causes the carriers generated in the p-type region and the n-type region to be concentrated on the intrinsic semiconductor layer, which will further enhance the sensitivity and the response speed of the light receiving element. When the light receiving element is formed in a superlattice structure by stacking a plurality of unit structures, a subband is formed in a quantum well and carrier generation between the subbands within the lightly doped semiconductor layer is possible by irradiation with light, which is expected to enhance sensitivity to short-wavelength components. In this structure, the direction of travel of the incident light can be optionally determined, as shown in FIG. 1, and the positions of the electrodes changed accordingly. When the light receiving element is formed in a structure as shown in FIG. 3, electrodes can be formed on the side surfaces and the direction of travel of the incident light is perpendicular to the layers, and so shadowing loss attributable to the electrodes is negligible.

DETAILED DESCRIPTION OF THE PREFERRED EMBODIMENT OF THE PRESENT INVENTION

Light receiving elements embodying the present invention will be described in detail hereinafter. Although a light receiving element in accordance with the present invention can be fabricated by injecting ions into a bulk semiconductor, it is easier to fabricate the light receiving element by stacking layers on a semiconductor substrate as shown in FIG. 3, because the thickness of the layers must be provided with an accuracy on the order of several micrometers. Therefore, a molecular beam epitaxial (MBE) method or a metal organic chemical vapor deposition (MOCVD) method capable of controlling film thickness and of readily carrying out selective doping, are suitable for fabricating the light receiving element.

(Example 1)

Figure 6:
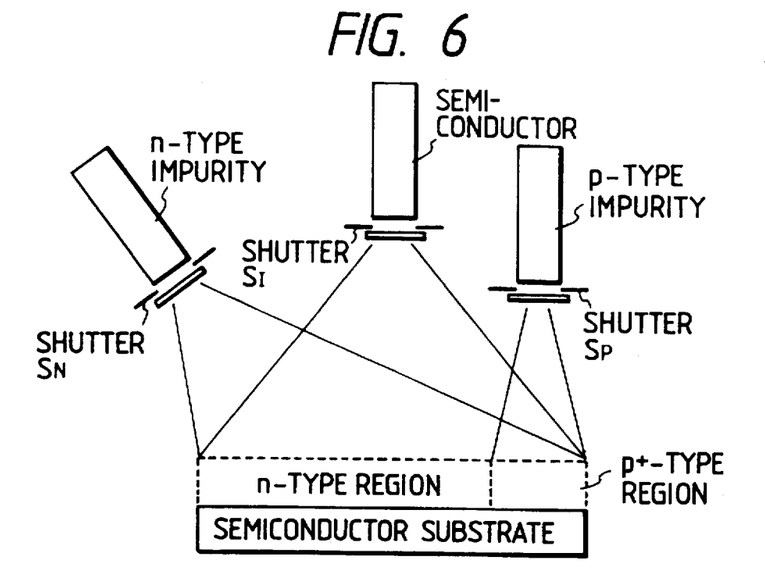
FIG. 6 is a diagrammatic view for explaining a procedure for fabricating a light receiving element in accordance with this invention.

A procedure of a shutter control system for fabricating a light receiving element in a first embodiment according to the present invention will be described with reference to FIG. 6.

Figure 7:
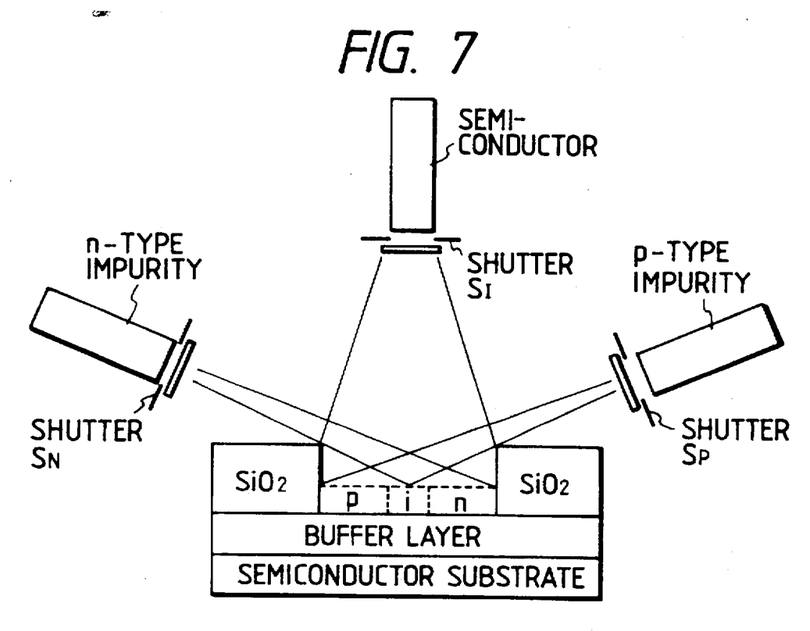
FIG. 7 is a diagrammatic view for explaining another procedure for fabricating a light receiving element in accordance with this invention.

A Si beam produced by electron gun heating is projected on a Si (100) substrate to form a Si layer of having a thickness on the order of 1 m over the surface of the Si substrate. At the same time, an n-type dopant beam is projected on the Si layer so as to sweep the entire area of the Si layer, and a p-type dopant beam is projected on the Si layer so as to sweep a restricted area on the Si substrate. The n-type dopant beam is a beam of phosphorus (P), and the p-type dopant beam is a beam of boron (B). Shutters $S_N$ and $S_p$ are controlled so as to inject B atoms at $1.0\times10^{19}/cm^3$ and to inject P atoms at $1.0\times10^{15}/cm^3$ into the Si layer. Thus, a pn junction semiconductor layer having an in-plane pn junction is formed. Then, the shutter $S_p$ is closed and the P density is reduced to $1.0\times10^{16}/cm^3$ to form a Si layer, i. e. , a lightly doped semiconductor layer, having a thickness of 0.1 μm. It is desirable to form an undoped Si layer having a thickness on the order of several tens of angstroms as a spacing layer by simultaneously closing the shutters $S_{NA}$ and $S_p$. Then, the shutter $S_p$ is opened to form another pn junction semiconductor layer which is 1 μm in thickness having an in-plane pn junction. Thus, an element having the band structure shown in FIG. 2 is fabricated. Then, Al films of which are 0.5 μm in thickness are formed respectively on the opposite ends of the layers to complete a light receiving element. In another method of forming a pn junction semiconductor layer, using a shutter control operation, a dielectric film, such as a silicon dioxide ($SiO_2$) film, is used as a mask to form a shaded part for doping, as shown in FIG. 7. The mask is removed after completing growth. In this case, a considerably steep junction boundary is formed.

The electrode connected to the n-type region and the lightly doped region must have a high n-type impurity density, and the electrode connected to the p-type region and the lightly doped region must have a high p-type impurity density.

(Example 2)

A procedure employing ion guns for fabricating a light receiving element in a second embodiment according to the present invention will be described with reference to FIG. 7. A gallium-arsenide(GaAs) and an aluminum-gallium-arsenide(AlGaAs) material are used for forming a modulation doped structure, and Ga, As and Al are used as evaporation materials.

Figure 8:
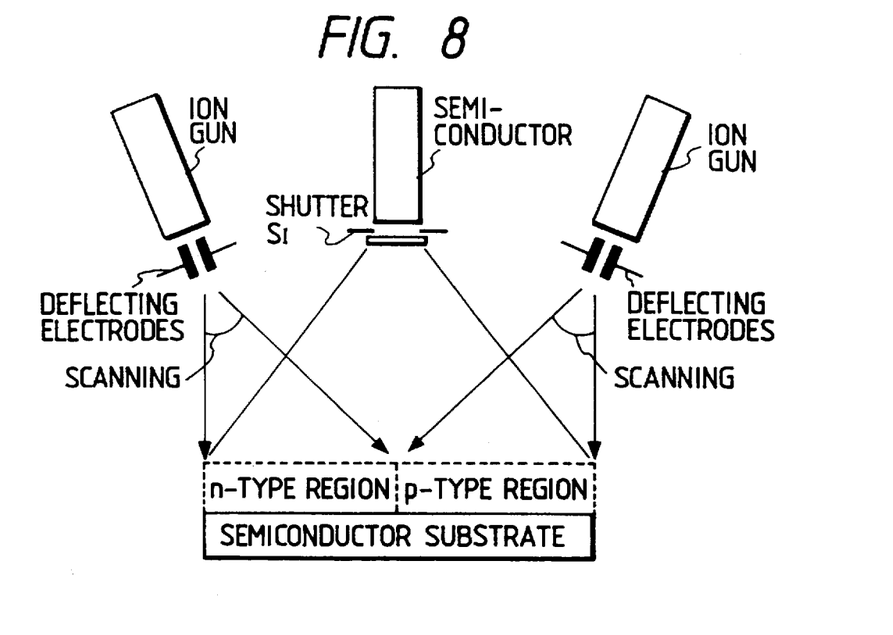
FIG. 8 is a diagrammatic view for explaining a third procedure for fabricating a light receiving element in accordance with this invention.
Figure 9:
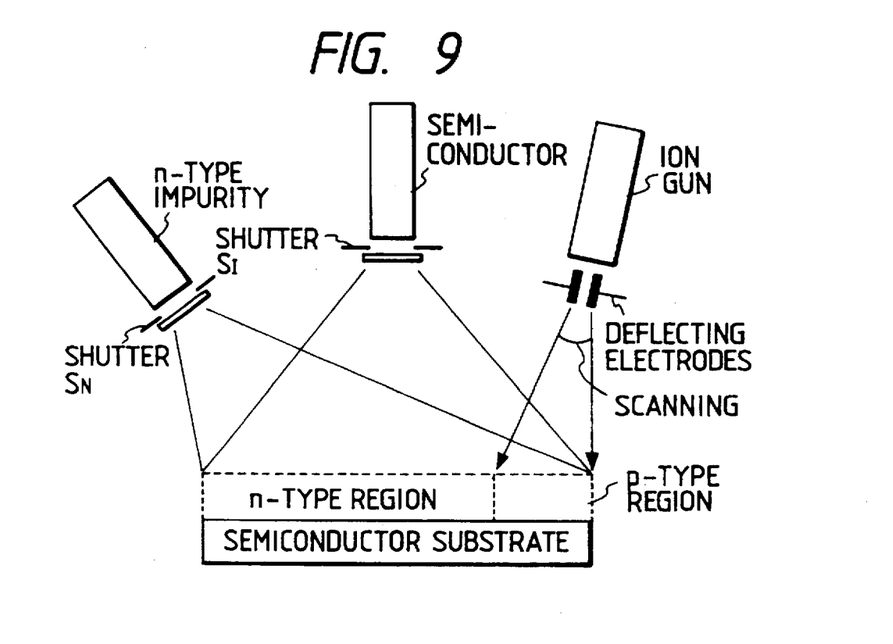
FIG. 9 is a diagrammatic view for explaining a fourth procedure for fabricating a light receiving element in accordance with this invention.

Firstly, an undoped GaAs layer which is 0.8 μm in thickness is formed on a GaAs (100) substrate. Then, the shutter of an ion gun for Al is opened to form a 0.1 μm thick $Al_{0.3}Ga_{0.7}As$ layer, and two ion guns direct a beam of beryllium (Be) ions, i.e., a p-type dopant, and a beam of silicon (Si) ions, i.e., an n-type dopant, respectively, at the layer to dope the layer with an impurity density of $6.0\times10^{18}/cm^3$. The beams of ions are moved so as to sweep areas, respectively, to form a pn junction, semiconductor layer having an in-plane pn junction as shown in FIG. 8. Then, the shutter of the ion gun for Al is closed to form a 0.5 μm thick undoped GaAs layer, i. e., a lightly doped semiconductor layer, and then the foregoing steps are repeated to form another 0.1 μm thick pn junction semiconductor layer having an in-plane pn junction to complete an element having a structure as shown in FIG. 4. Another procedure for fabricating a light receiving element, in a modification of this procedure, employs ion guns provided respectively with shutters, as shown in FIG. 9. This procedure controls the shutters to inject an n-type dopant into the entire area of an $Al_{0.3}Ga_{0.7}As$ layer and to inject a p-type dopant into a restricted area on the $Al_{0.3}Ga_{0.7}As$ layer, and also to form a pn junction semiconductor layer having an in-plane pn junction.

(Example 3)

Application of a light receiving element embodying the present invention to an optical communication system will be described hereinafter.

Figure 10:
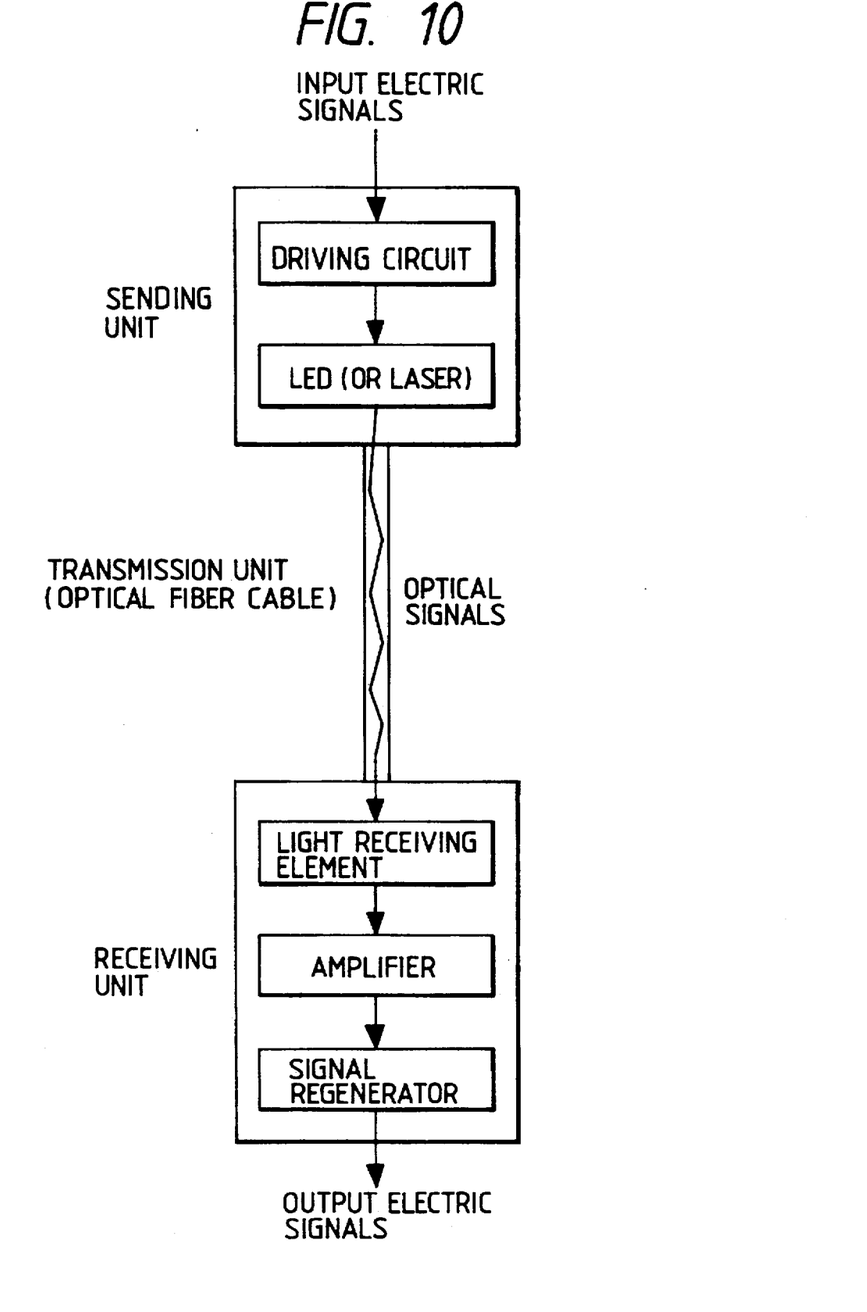
FIG. 10 is a block diagram of an optical communication system.

FIG. 10 is a schematic illustration of an optical communication for optical communication system between two stations. The optical communication system comprises a sending unit, a transmission unit and a receiving unit. The sending unit has a driving circuit and a LED or a laser. The driving circuit drives the LED or the laser and transforms the input electric signals to optical signals. The optical signals are transmitted by the optical fiber cable of the transmission unit to the receiving unit installed in the station of the destination. The receiving unit has a light receiving element, an amplifier and a signal regenerator. The light receiving element detects the optical signals. Then, the output signal of the light receiving element is amplified by the amplifier and is regenerated to form the electric signals.

Since the light receiving element using the present invention is capable of detecting faint optical signals with a high sensitivity at a high response speed, an optical communication system capable of operating at a high speed and at a low power consumption rate can be realized by using a receiving unit provided with the light receiving element of the present invention.

(Example 4)

Application of the light receiving elements in accordance with the present invention to a solar cell module will be described hereinafter.

Figure 11:
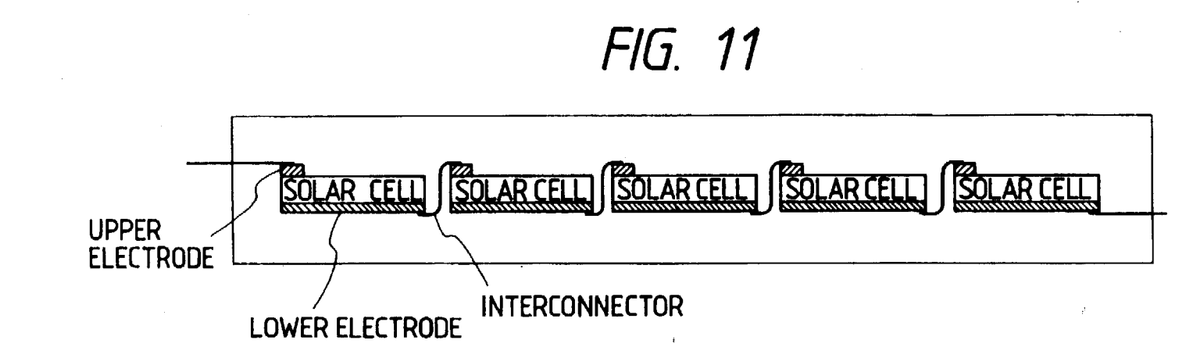
FIG. 11 is a diagrammatic view of a conventional solar cell module.
Figure 12:
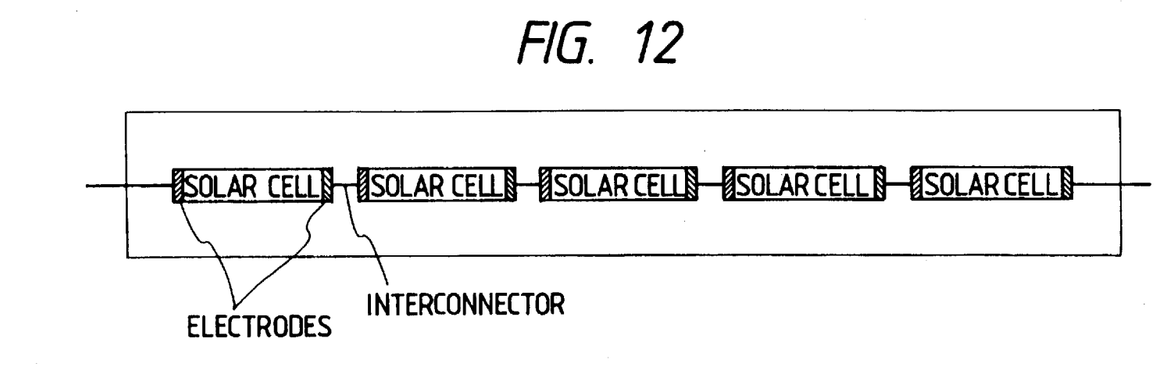
FIG. 12 is a diagrammatic view of a solar cell module in accordance with this invention.

A solar cell, similarly to the light receiving element, collects carriers generated by the incident light to convert the energy of the incident light into electric energy. Accordingly, the structure and the action of the light receiving element in accordance with the present invention are basically applicable to solar cells. In a solar cell having- the element structure of the present invention, the lifetime of carriers is long because the recombination ratio of the carriers generated by light is low and the drift mobility is high. Since the electrodes are formed on the side surface of the element, shadowing loss in solar radiation attributable to the electrodes is negligible, and hence the output current of the solar cell increases. The element structure shown in FIG. 5 is preferable for solar cells formed on a semiconductor substrate having a large area The current solar cell module is formed by tens of solar cells each formed on a semiconductor substrate. When the solar cell module is required to provide a high output voltage, the solar cells are connected in series. Since each of the conventional solar cells is provided with electrodes respectively on the upper and lower surfaces thereof, loop-shaped interconnectors, as shown in FIG. 11, must be used for connecting the adjacent solar cells. On the other hand, since solar cells having a structure in accordance with the present invention are provided with electrodes on their side surfaces, the adjacent solar cells can be connected by very simple, short interconnectors, as shown in FIG. 12. Therefore, the interconnectors are not stressed excessively and the frequency of breakage of the interconnectors is reduced. Consequently, the environmental durability and the reliability of the solar cell module are enhanced. Since the solar cell module comprising solar cells of a structure in accordance with the present invention needs interconnectors shorter than those of the solar cell module comprising the conventional solar cells, the solar cells can be easily connected and the solar cell module can be fabricated at a reduced cost.

What is claimed is:

1. A light receiving element comprises a plurality of unit structures each having two pn junction semiconductor layers; and a lightly doped semiconductor layer having a low impurity density, lower than those of p-type regions and n-type regions of the two pn junction semiconductor layers, and which is sandwiched between the two pn junction semiconductor layers;

wherein the p-type regions of the pn junction semiconductor layers are disposed opposite to each other on opposite sides of the lightly doped semiconductor layer, respectively, and the n-type regions of the pn junction semiconductor layers are disposed opposite to each other on opposite sides of the lightly doped semiconductor layer, respectively;

wherein the unit structures are formed so that the pn junctions thereof are perpendicular to the surface of a substrate; and wherein said plurality of unit structures are arranged regularly in the horizontal direction on the substrate, pn junctions whose impurity density is higher than that of the unit structure are formed between the unit structures, and said pn junctions are connected to the p-type regions and the n-type regions, respectively.

2. A light receiving element according to claim 1, wherein the carriers of the semiconductors move mainly through the lightly doped semiconductor layer.

3. A light receiving element according to any one of claim 1, wherein said semiconductors are formed on a surface of a semiconductor substrate, and electrodes are connected to said semiconductor layers.

4. A light receiving element according to any one of claim 1, wherein said an electrode connected to the n-type region and the lightly doped semiconductor layer has a high n-type impurity density, and an electrode connected to the p-type region and the lightly doped semiconductor layer has a high p-type impurity density.

5. A light receiving element according to claim 1, wherein said semiconductor is a compound semiconductor formed of a semiconductor material of the group IV or the group III and a semiconductor material of the group V, a compound semiconductor formed of a substance of the group II and that of the group VI, or a semiconductor comprising mixed crystals of those compound semiconductors.

6. A light receiving element according to any one of claim 1, wherein the materials of the impurity-doped layers forming said pn junctions are semiconductor materials having a large band gap, and the material forming said lightly doped semiconductor layer is a semiconductor having a narrow band gap.

7. A light receiving element according to any one of claim 1, wherein the impurity density of said lightly doped semiconductor layer is $5/0 \times 10^{16}/cm^3$ or below.

8. A light receiving element according to claim 1, wherein said unit structures are stacked to form a superlattice.

9. A light receiving element according to claim 1, wherein shutter control or an ion beam apparatus is used in forming the pn junctions.

10. An optical communication system having a receiving unit for receiving light signals, wherein said receiving unit is provided with the light receiving element defined in claim 1.

11. A solar cell module which includes a plurality of said light receiving elements defined in claim 1.

* * * * *